United States Patent [19]

Abbas

[11] Patent Number: 4,588,883
[45] Date of Patent: May 13, 1986

[54] MONOLITHIC DEVICES FORMED WITH AN ARRAY OF LIGHT EMITTING DIODES AND A DETECTOR

[75] Inventor: Daniel C. Abbas, Webster, N.Y.

[73] Assignee: Eastman Kodak Company, Rochester, N.Y.

[21] Appl. No.: 553,324

[22] Filed: Nov. 18, 1983

[51] Int. Cl.⁴ .............................................. G01J 1/32
[52] U.S. Cl. .................................... 250/205; 250/551
[58] Field of Search ................. 250/551, 205, 213 A; 357/19; 358/241; 455/602

[56] References Cited

U.S. PATENT DOCUMENTS

| | | | |
|---|---|---|---|
| 3,480,783 | 11/1969 | Mankarious | 250/551 |
| 4,074,143 | 2/1978 | Rokos | 250/205 |
| 4,074,320 | 2/1978 | Kapes, Jr. | 358/241 |
| 4,097,732 | 6/1978 | Krause et al. | 250/205 |
| 4,284,884 | 8/1981 | Dyment et al. | 250/205 |
| 4,297,653 | 10/1981 | Scifres et al. | 357/19 |
| 4,521,681 | 6/1985 | Inaba et al. | 250/213 A |

Primary Examiner—David C. Nelms
Assistant Examiner—James Gatto
Attorney, Agent, or Firm—Raymond L. Owens

[57] ABSTRACT

An array of light emitting diodes are fabricated in the substrate of a monolithic device. Each diode, when forward biased, produces output light which is emitted from the device and subsurface light which is transmitted through the substrate. A single detector is fabricated in the substrate and detects subsurface light from any forward biased light emitting diode of such array. In response to such subsurface light, the detector produces a signal which is representative of the intensity of output light emitted from the device by such forward biased light emitting diode.

5 Claims, 4 Drawing Figures

MONOLITHIC DEVICES FORMED WITH AN ARRAY OF LIGHT EMITTING DIODES AND A DETECTOR

CROSS-REFERENCE TO RELATED APPLICATIONS

Reference is made to my commonly assigned U.S. patent application Ser. No. 553,325, entitled "Bistable Circuits Having a Monolithic Device Formed with Light Emitting Diodes and Detectors", filed on Nov. 18, 1983.

FIELD OF THE INVENTION

The present invention relates to light emitting diode arrays which can be used as exposure sources for electronic printing or the like.

DESCRIPTION OF THE PRIOR ART

The term "monolithic device" as used herein refers to a device that is formed on a single semiconductor crystal chip, with the semiconductor chip being formed from, for example, extrinsic gallium arsenide.

The term "light emitting diode" (LED) as used herein refers to a semiconductor device that emits radiation in the optical spectrum (i.e., infrared through ultra violet) in response to an applied forward bias voltage from an external power source. An LED has a p-n junction provided by two extrinsic semiconductors. When forward biased by an external power source, such a diode emits optical radiation. LEDs are attractive sources of optical radiation because they are easy to form, inexpensive to make, highly efficient, and reliable. They are widely used as miniaturized lamps and in display devices such as calculators and watches.

High-density, linear LED arrays can be fabricated in a monolithic device and used as light sources in electronic printing applications. In such applications, light from the diodes of an array illuminates a photosensitive medium to produce an image. With existing technology, it is possible to fabricate an array of light emitting diodes on a single gallium arsenide chip which, without further correction, is adequate for two-level exposure. A two-level exposure is produced when an LED can selectively be turned on or off. LED arrays with a large number of exposure levels are required for good-quality, continuous-tone images. At any given exposure level, any one of the LEDs should produce light with an intensity that is within an acceptable range. For example, the light intensity of a diode at a given exposure level may be required to be within a few tenths of a percent of the light intensity at the same exposure level of any other array light emitting diode. If such is not the case, undesirable bands may appear in the output image.

The output light intensity of LEDs fabricated in a monolithic device and driven at constant current degrades nonuniformly with usage. In order to prevent undesirable bands, it is necessary to provide dynamic correction, i.e., the output light intensity at each exposure level of each LED of an array must be periodically measured and corrected so that across the entire array, each exposure level is within the proper intensity range.

In order to provide this dynamic correction, a solid-state detector is mounted external to an integrated LED array so that it can be irradiated by any given LED in the array. In response to such irradiation, the detector produces a photocurrent. Each LED of the array is driven individually and the photocurrent generated by the detector is measured. The driving voltage for an LED is adjusted in response to this measurement. This process is continued for each LED until at each exposure level, all the diodes produce a uniform output within a predetermined acceptable intensity range. The ideal location for placing the detector for accurate measurement would be just over the array of LEDs. This is of course not practical since the detector would block all the useful exposure light produced by the diode. The placement of the detector often necessitates the use of additional optics. Further, the detector may be affected by dirt, debris and stray light.

The object of this invention is to provide effective dynamic correction of an integrated array of LEDs without using an external detector.

SUMMARY OF THE INVENTION

In accordance with the present invention, a monolithic device which includes a semiconductor substrate has, fabricated in that substrate, an array of LEDs and a detector. Each of the LEDs when forward biased, produces output light which is emitted from the device and subsurface light which is transmitted through the substrate. The detector is located so that it will receive subsurface light from any forward biased LED. In response to such subsurface light, the detector produces an output signal representative of the intensity of light emitted from the device by the diode.

The output signals provided by the detector are then used for dynamic correction of the output light intensity of the LEDs.

BRIEF DESCRIPTION OF THE DRAWINGS

In the detailed description of the preferred embodiment of the invention presented below, reference is made to the accompanying drawings, in which.

DETAILED DESCRIPTION OF THE PREFERRED EMBODIMENT

Figure 1:
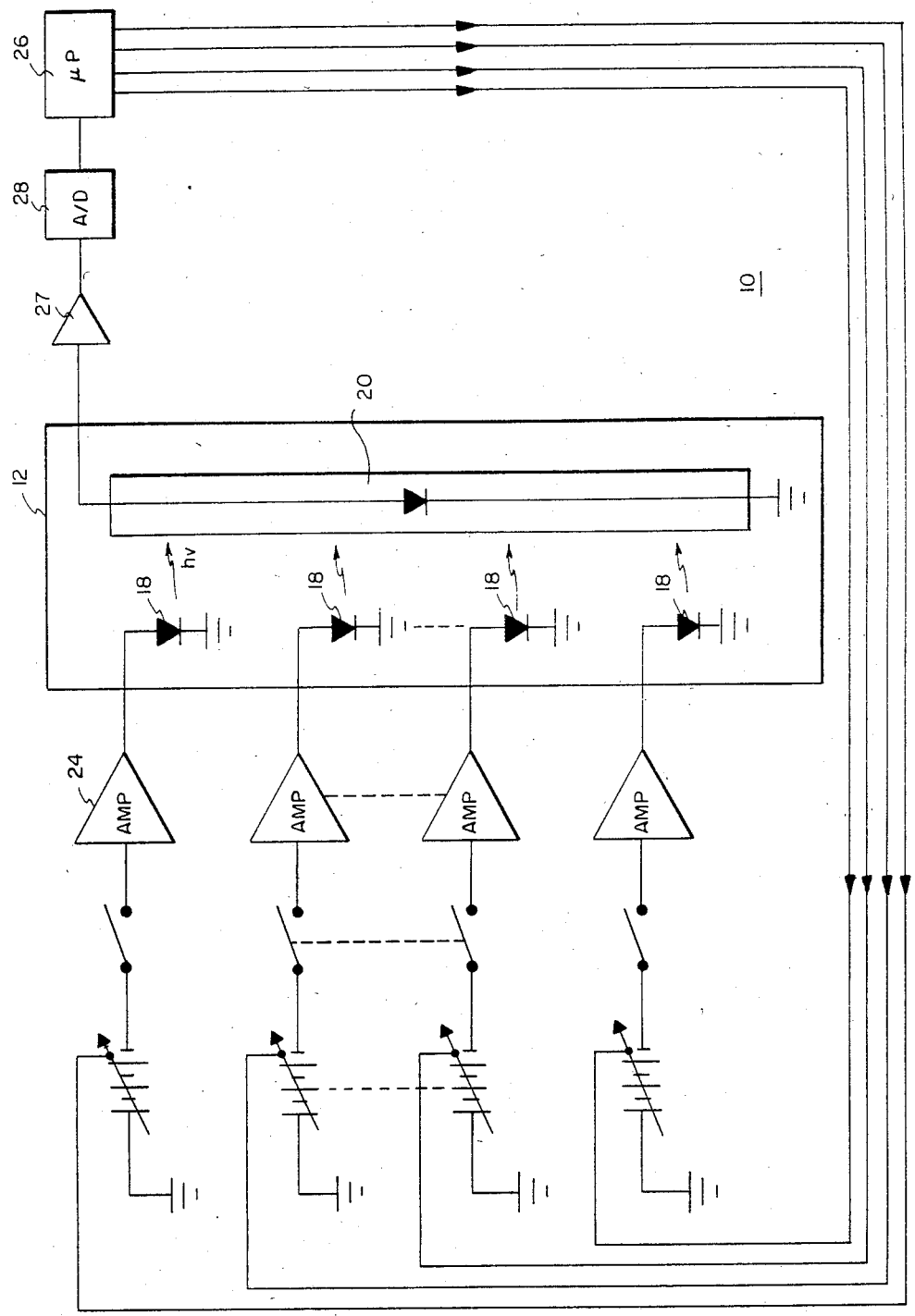
FIG. 1 is a schematic view of a system which includes a monolithic device having an array of light emitting diodes and a detector fabricated thereon.
Figure 2:
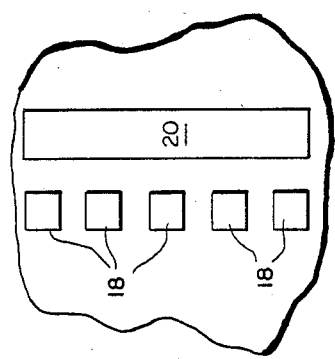
FIG. 2 is a schematic plan view showing the general organization of the monolithic device shown in FIG. 1.

In FIG. 1 is shown a schematic representation of a system 10, which includes a monolithic device 12. On the device are integrated a plurality of light emitting diodes 18 and a single detector 20, which will be described in detail later in the specification. At this point, it is sufficient to note the general spatial arrangement of the LEDs 18 and the detector 20, which is shown in the schematic plan view of FIG. 2.

In FIG. 1, the system 10 includes a separate adjustable power supply V for each LED 18. The power supply is coupled through a switch S and a voltage-to-current converting amplifier 24 to its corresponding LED. When its switch S is closed, each amplifier provides a forward current to its LED 18 which then emits output light at a selected intensity from the device. The light is used for exposing an image such as in electronic printing or the like. A forward biased LED also produces subsurface light, which illuminates the detector 20. The symbol (hv) in FIG. 1 represents this subsurface light. The detector is connected to current-to-voltage converting amplifier 27, which provides a signal to an analog-to-digital (A/D) converter 28, which in turn provides a digital input to a microprocessor 26.

Consider dynamic correction of the intensity of light output of each of the LEDs 18 at a particular exposure level. During such correction, the microprocessor 26 provides an adjusting signal to one of power supplies V and also closes its corresponding switch S. The power supply forward biases the LED which produces subsurface light which illuminates the detector 20. In response, the detector 20 produces an output signal. This signal is a monotonically increasing function which represents the intensity of output light emitted from the device 12. It is provided as an input to the A/D converter 28. The converter 28 applies its digital output to the microprocessor 26 which has been programmed to compare the level of this signal with a range of signal levels in its memory to determine whether it is within such range. If it is, the output light intensity is within an acceptable intensity range. If it is not, further adjustment needs to be made to the power supply voltage. The microprocessor 26 repeats this process until the signal level produced by the detector is within the signal level range stored in its memory. The final adjusting signal is then stored in the memory. It is then used during operation of the array until changed by the next dynamic correction.

Figure 3:
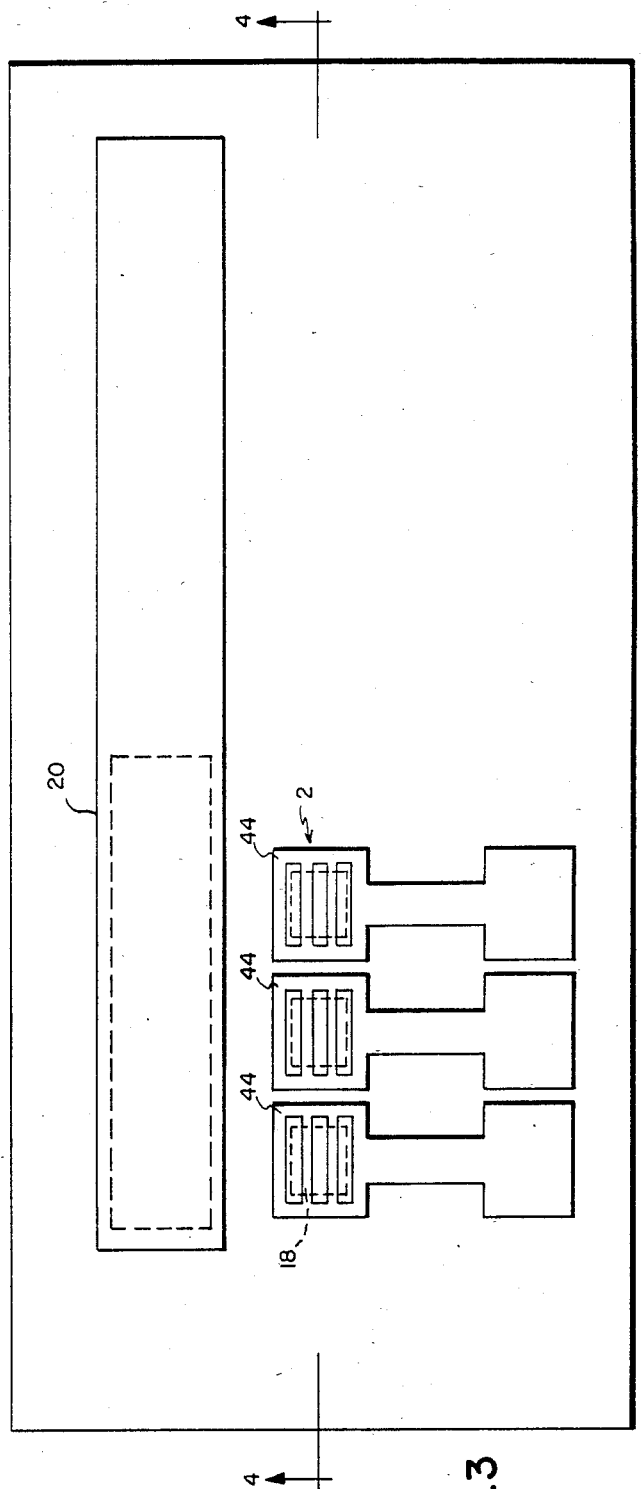
FIG. 3 is a more detailed plan view of the monolithic device shown in FIG. 1.
Figure 4:
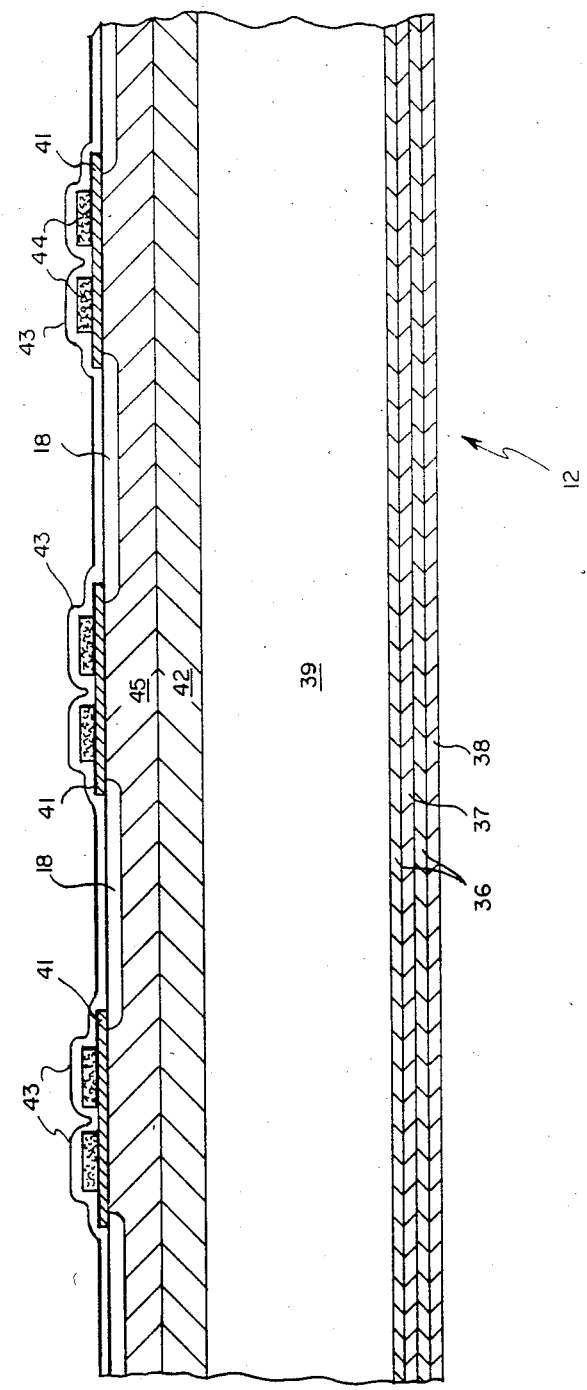
FIG. 4 is a setional view taken along the lines 4—4 of FIG. 3.

Turning now to FIGS. 3 and 4 where the device 12 is shown in detail. Layer 39 is a semiconductor crystal of n-type gallium arsenide of a thickness from about 250 $\mu$m to 400 $\mu$m. A layer 42 of n-type, grade-composition, gallium arsenide phosphide is grown epitaxially on the surface of the semiconductor crystal 39. The amount of phosphorus in the layer 42 is gradually increased as it is grown such that its composition varies from GaAs at the beginning of growth to $GaAs_{0.7}P_{0.3}$ at the end of growth. Layer 42 is from about 15 $\mu$m to 30 $\mu$m thick. A layer 45 of constant composition $GaAs_{0.7}P_{0.3}$ is then grown on the graded composition layer 42 to a thickness of from about 15 $\mu$m to 30 $\mu$m. Those skilled in the art will realize that the graded composition layer 42 reduces the effect of the strain induced on the devices fabricated in the constant composition layer 45 due to the lattice mismatch between the GaAs layer 39 and the $GaAs_{0.7}P_{0.3}$ layer 45.

A film 41 of silicon nitride is grown by plasma deposition on the epitaxial layer 45 to form the LED's 18. Windows are etched by a conventional photolithographic technique in the film 41. The silicon nitride film 41 serves as a mask for the diffusion of p-type impurities (for example, zinc) into layer 45. A film of zinc oxide is grown on the silicon nitride film 41, and on the epitaxial layer 45 within the windows in the silicon nitride film, by chemical vapor deposition from dimethyl zinc and oxygen. A film of silicon dioxide is then grown on both sides of the device 12 by chemical vapor deposition from silane and oxygen to protect the device 12 from decomposition during the diffusion process. The device 12 is now placed in a furnace at an elevated temperature for a time interval sufficient for the zinc to diffuse into the n-type layer 45 to a depth of about 2 $\mu$m, forming the p-type regions of the light emitting diodes 18 and detector 20. The zinc oxide film serves as a source of zinc; other methods can be used to diffuse zinc into layer 45, e.g. vapor-phase transport from a zinc arsenide source, zinc-doped spin-on emulsions, and ion implantation. The distance from each LED 18 to the detector 20 can be about 100 $\mu$m. As viewed in FIG. 3, each LED 18 defines a square, with each side of the square being about 100 $\mu$m in length.

The silicon dioxide films and the zinc oxide film are now removed from the device 12 and a film of silicon nitride 43 is deposited on the silicon nitride layer 41, and on the epitaxial layer 45 within the windows in the silicon nitride film, to an appropriate thickness to form an antireflection coating. Metal electrodes 44 for contacting the p-type regions of the light emitting diodes and detector are formed from evaporated aluminum using standard photolithographic and metal-liftoff techniques. The electrodes are then alloyed to layers 41 and 45 to improve the electrical contact between the electrodes 44 and the epitaxial layer 45 and to improve the mechanical adhesion of the electrodes 44 to the layers 41 and 45. Electrodes 44 are best shown in FIG. 3. A layer 36 formed of evaporated nickel, a layer 37 formed of evaporated gold germanium, and another layer 36 formed of evaporated nickel are deposited successively on the bottom side of the gallium arsenide crystal 39. The metal layers 36 and 37 are then alloyed to the semiconductor 39 to improve the electrical contact. A layer 38 formed of evaporated gold is deposited on layer 36. Layer 38 is electrically connected to ground (see also FIG. 1). Layers 36, 37 and 38 as will be appreciated by those skilled in the art, make good ohmic electrical ground contact to the n-type gallium arsenide crystal 39.

As has been discussed above, optical radiation is produced at the p-n junction of each light emitting diode 18 upon the application of a forward current. This current is supplied by an amplifier 24. The detector is fabricated to detect light from each LED through the substrate material. The top surface of the detector is completely opaqued by the aluminum to eliminate interference from stray light. The detector is a p-n junction, formed by the same process used to make each LED. As shown in FIG. 3, it is however much longer than that of any diode 18.

The invention has been described in detail with particular reference to a preferred embodiment thereof, but it will be understood that variations and modifications can be effected within the spirit and scope of the invention.

I claim:

1. A monolithic device including a semiconductor substrate, comprising:
   (a) an array of light emitting diodes fabricated in the substrate, a plurality of adjustable voltage source means, and each diode of the array being responsive to a separate forward bias voltage to produce output light which is emitted from the device and subsurface light which is transmitted through the substrate; and
   (b) a single detector fabricated in the substrate and located so as to detect subsurface light from any selected light emitting diode of such array and adapted to produce a signal representative of the intensity of output light emitted from such forward biased light emitting diode.

2. The monolithic device of claim 1 wherein the array of light emitting diodes and the detector comprise an extrinsic material diffused into the substrate.

3. The monolithic device of claim 2 wherein an opaque layer is formed on the detector to prevent the activation of the detector by stray light.

4. The invention defined in claim 3 further comprising:
- a plurality of adjustable voltage source means, each one connected to a corresponding light emitting diode, for applying a forward bias voltage to such diode; and
- means responsive to the detector signal caused by a forward biased light emitting diode for adjusting corresponding adjustable voltage source means to change the forward bias voltage on such diode so that the output light intensity of such diode is within a predetermined intensity range.

5. Apparatus for providing dynamic correction of the output light intensity from light emitting diodes, comprising:

(a) a monolithic device having a substrate with an array of light emitting diodes fabricated in such substrate and a single detector fabricated in such substrate in spaced relationship to the array, each diode being responsive to a forward bias voltage for producing output light and subsurface light which is transmitted through the substrate and illuminates the detector, which produces a signal representative of the intensity of such output light;

(b) a plurality of adjustable voltage source means, each one connected to a separate light emitting diode for applying a forward bias voltage to its connected diode; and (c) means responsive to the detector signal caused by forward biasing a light emitting diode for adjusting its adjustable voltage source means to change the forward bias voltage on such diode so that its output light intensity is within a predetermined intensity range, whereby such apparatus provides dynamic corrections.

* * * * *